US011348659B2

(12) United States Patent
Cariello

(10) Patent No.: US 11,348,659 B2
(45) Date of Patent: *May 31, 2022

(54) ADJUSTABLE VOLTAGE DROP DETECTION THRESHOLD IN A MEMORY DEVICE

(71) Applicant: Micron Technology, Inc., Boise, ID (US)

(72) Inventor: Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

This patent is subject to a terminal disclaimer.

(21) Appl. No.: 16/853,050

(22) Filed: Apr. 20, 2020

(65) Prior Publication Data

US 2020/0251175 A1   Aug. 6, 2020

Related U.S. Application Data

(63) Continuation of application No. 16/017,315, filed on Jun. 25, 2018, now Pat. No. 10,629,288.

(51) Int. Cl.
*G11C 29/00* (2006.01)
*G11C 29/50* (2006.01)
(Continued)

(52) U.S. Cl.
CPC ........ *G11C 29/50004* (2013.01); *G01R 31/30* (2013.01); *G11C 16/0483* (2013.01);
(Continued)

(58) Field of Classification Search
CPC ... G11C 29/50004; G11C 29/44; G11C 29/52; G11C 16/0483; G11C 2029/5004; G01R 31/30
(Continued)

(56) References Cited

U.S. PATENT DOCUMENTS 9,047,932 B1   6/2015 Nicholls et al.
9,478,303 B1 * 10/2016 Parker .................. G11C 16/349
(Continued)

FOREIGN PATENT DOCUMENTS

CN   101345088 A   1/2009
CN   101868829 A   10/2010
(Continued)

OTHER PUBLICATIONS

"International Application Serial No. PCT US2019 038241, International Preliminary Report on Patentability dated Jan. 7, 2021", 7 pgs.
(Continued)

*Primary Examiner* — Christine T. Tu
(74) *Attorney, Agent, or Firm* — Schwegman Lundberg & Woessner, P.A.

(57) ABSTRACT

Devices and techniques for an adjustable voltage drop detection threshold in a memory device are disclosed herein. A voltage drop detection threshold of a memory device is dynamically established. A power loss event is triggered when the supply voltage falls below the voltage drop detection threshold. An error parameter associated with performing multiple memory operations on the memory device is collected. The multiple memory operations are performed while applying a supply voltage at a second supply voltage level of the memory device which is less than a first supply voltage level established as a first operating voltage for the memory device. Determining whether the error parameter is below an allowable error threshold. In response to determining that the error parameter is below the allowable error threshold, the voltage drop detection threshold is established at a voltage level less than the first supply voltage level.

19 Claims, 9 Drawing Sheets

(51) Int. Cl.
- *G11C 16/04* (2006.01)
- *G01R 31/30* (2006.01)
- *G11C 29/52* (2006.01)
- *G11C 29/44* (2006.01)

(52) U.S. Cl.
CPC .............. *G11C 29/44* (2013.01); *G11C 29/52* (2013.01); *G11C 2029/5004* (2013.01)

(58) Field of Classification Search
USPC ........ 714/721, 719, 718, 745, 704; 324/433, 324/522, 523, 525, 759, 763, 760, 765; 365/204, 201, 210.12, 211
See application file for complete search history.

(56) References Cited

U.S. PATENT DOCUMENTS

| | | |
|---|---|---|
| 10,360,101 B2 | 7/2019 | Kodama et al. |
| 10,629,288 B2 | 4/2020 | Cariello et al. |
| 2008/0091990 A1 | 4/2008 | Bruce et al. |
| 2014/0043903 A1 | 2/2014 | Ok et al. |
| 2016/0117272 A1 | 4/2016 | Thomson et al. |
| 2016/0218740 A1* | 7/2016 | Parthasarathy ..... G06F 11/1068 |
| 2016/0225436 A1 | 8/2016 | Wang et al. |
| 2018/0076829 A1 | 3/2018 | Ueki et al. |
| 2019/0088336 A1* | 3/2019 | Lin ........................ G11C 16/26 |
| 2019/0392918 A1 | 12/2019 | Cariello |

FOREIGN PATENT DOCUMENTS

| | | |
|---|---|---|
| CN | 104409097 A | 3/2015 |
| CN | 105164754 A | 12/2015 |
| CN | 104409097 B | 10/2017 |
| WO | WO-2020005709 A1 | 1/2020 |

OTHER PUBLICATIONS

"International Application Serial No. PCT/US2019/038241, International Search Report dated Oct. 4, 2019", 3 pgs.

"International Application Serial No. PCT/US2019/038241, Written Opinion dated Oct. 4, 2019", 5 pgs.

"Chinese Application Serial No. 201980048980.3, Office Action dated Aug. 31, 2021", w/o English translation, 5 pgs.

"Chinese Application Serial No. 201980048980.3, Voluntary Amendment Filed Jun. 30, 2021", w/ English Claims, 23 pgs.

* cited by examiner

ADJUSTABLE VOLTAGE DROP DETECTION THRESHOLD IN A MEMORY DEVICE

PRIORITY APPLICATION

This application is a continuation of U.S. application Ser. No. 16/017,315, filed Jun. 25, 2018, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values).

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer or mobile device (e.g., a smartphone), having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

NAND memory devices (e.g., controllers in or associated with the memory devices) can include a voltage drop detection circuit (Vdet) that indicates power loss events or catastrophic events when supply power to the memory devices falls below an operating voltage defined by a specification. Different components of the memory devices may operate at different voltage levels and indicating power loss events based on the specification of the memory devices may yield over conservative power loss event indication. Also in some cases the memory devices may be able to operate at voltage levels below the specification defined operating voltage yet the Vdet circuit will still indicate power loss at such levels.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
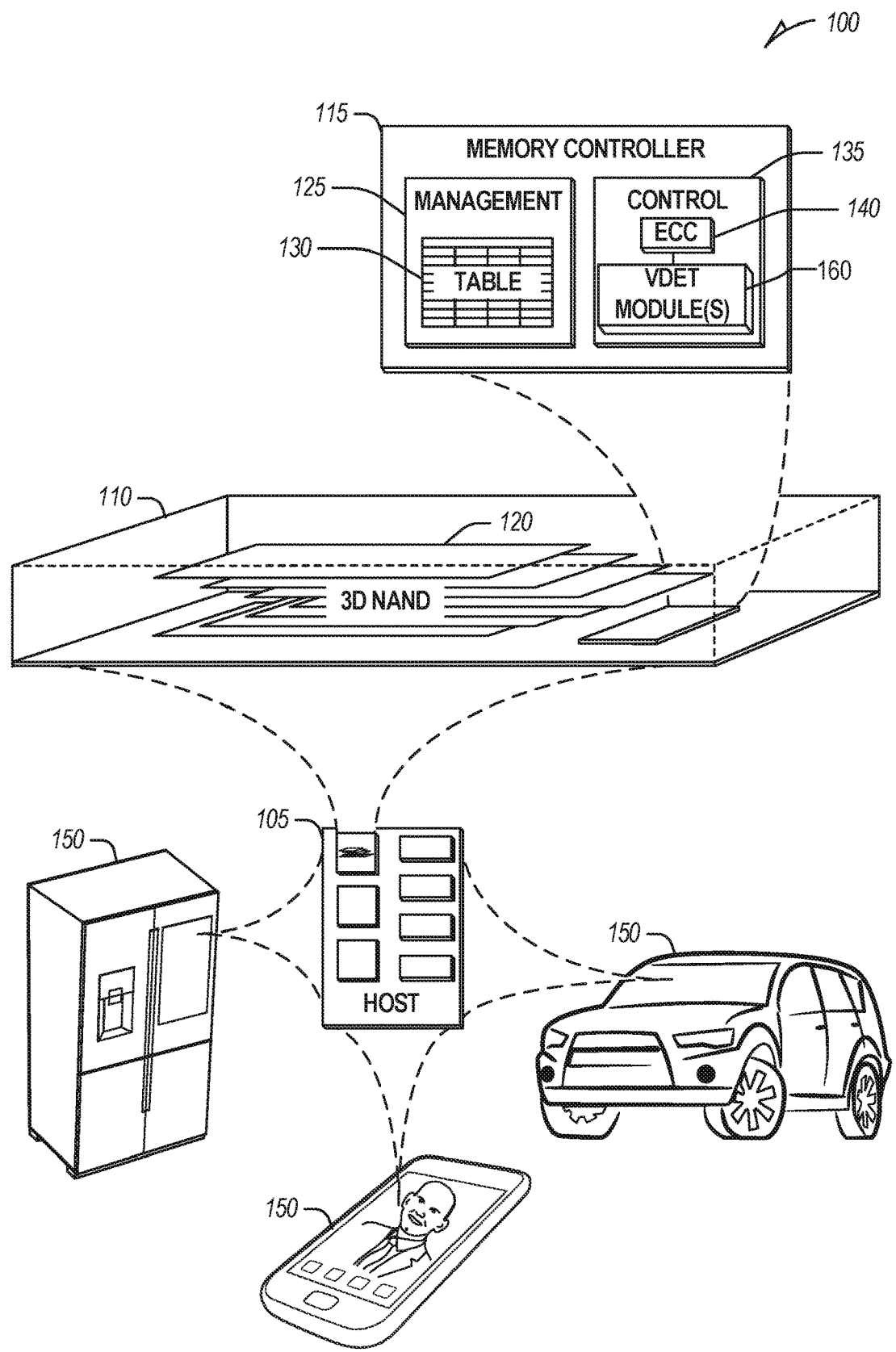
FIG. 1 illustrates an example of an environment including a memory device upon which one or more embodiments may be implemented.

This document addresses various techniques for optimizing one or more threshold voltages (e.g., the trigger supply voltage) of one or more voltage drop detection modules (Vdet module(s)) in or associated with one or more memory devices. This document discusses various techniques for training a set of devices during manufacture to operate at a given Vdet trigger supply voltage by progressively reducing the Vdet voltage while monitoring an error parameter (e.g., the bit-error-rate of an I/O bus, memory latches, and/or a memory array) to identify a lower (or lowest) possible trigger supply voltage for the Vdet module. In some implementations, behavior (e.g., error conditions) of the memory devices during their lifetime can be monitored to dynamically adjust (e.g., reduce) the pre-established Vdet trigger supply voltages. As referred to herein, memory devices may include the memory array cells, bus lines including latches of the bus, memory controllers, dies on which the memory array and other memory components are implemented, and any other component used to store information.

The Vdet module(s) may be off-chip, external and/or outside of a memory device or may be included in the memory device. The Vdet module may include one or more supply voltage threshold devices that compare a respective current supply voltage of respective components (e.g., latches of an I/O bus of memory device, a memory array including planes, cells, blocks, sub-blocks, or pages of the memory array) to a respective threshold value. For example, the Vdet module may be coupled to receive a current supply voltage (e.g., Vcc) from one or more components of a memory device. The Vdet module may determine whether the supply voltage is below a Vdet threshold voltage value. In response to determining that the supply voltage of the component is below the Vdet threshold value, the Vdet module may trigger (e.g., indicate) a power loss event (or catastrophic event).

As referred to herein, power loss event may indicate that power is below a minimum operating voltage of the memory device or may indicate that power is a threshold amount above the minimum operating voltage of the memory device. When the power loss event indicates that voltage is below the minimum operating voltage of the memory device, such an indication may initiate a power loss protection procedure (e.g., resetting the memory device). When the power loss event indicates that voltage is a threshold amount above the minimum operating voltage of the memory device, such an indication may initiate an interrupt to perform an error handling procedure (e.g., determining a BER of the last memory operation(s) to determine whether or not the threshold of the Vdet module can be reduced or changed). In some embodiments, the Vdet module may include two companion threshold devices that each generate a different type of power loss event. A first of the two companion threshold devices may be configured with a threshold voltage that is always one stop above the threshold voltage of the second of the two companion threshold devices. The first threshold device may be configured to generate a power loss event that interrupts a controller of the memory device and causes the controller to perform an error handling procedure to determine whether the thresholds of the two companion devices can be changed. The second threshold device may be configured to generate a power loss event that initiates a power loss protection procedure.

The Vdet threshold voltage(s) may be established when the given memory device or Vdet module is being manufactured or may be configured or adjusted after the memory device is manufactured. For example, the Vdet module may be initially set with a Vdet threshold voltage corresponding to the operating supply voltage of the memory device. A supply voltage at or substantially above (e.g., 1 mV above) the Vdet threshold voltage may be provided to memory device initially. After performing multiple memory operations (e.g., writing and reading data to the memory device, an error parameter (e.g., a BER) may be determined. The error parameter may be compared to an allowable error parameter threshold (e.g., to check if the BER is below a number of correctable BER values). If the error parameter is below the allowable error parameter threshold, the threshold voltage may be reduced by a given amount. In addition, the supply voltage to the memory device may be reduced by the same or different amount.

After the Vdet threshold voltage and the memory device supply voltage are reduced to a second supply voltage level, additional training may be performed to evaluate whether an error parameter threshold is exceeded by the error parameter value. For example, multiple memory operations may be performed on the memory device. After performing the multiple memory at the reduced second supply voltage level, a second error parameter (e.g., a BER) may be determined. The second error parameter may be compared to an allowable error parameter threshold (e.g., to check if the BER is below a number of correctable BER values). If the second error parameter is below the allowable error parameter threshold, the threshold voltage and the supply voltage may be further reduced below the second supply voltage level (e.g., by the same amount as before). If the second error parameter exceeds the allowable error parameter threshold, the Vdet module threshold may be set (or established) to a given amount above the current threshold value. In some implementations, the Vdet module threshold may be set to the last value at which the error parameter was below the allowable error threshold.

In some implementations, a consistency check may be performed for the Vdet module to set or establish the Vdet threshold value. To perform the consistency check, additional memory operations may be performed at the same second voltage supply level which resulted in the second error parameter exceeding the allowable error parameter threshold. If the same or substantially the same number of error parameter values result from these additional memory operations at the second supply voltage level, the system may determine that the errors are consistent. In such circumstances, the Vdet module threshold may be set (or established) to a given amount above the current threshold value. For example, the second voltage may be increased by 1 mV and the Vdet module associated with the memory device may be configured to trigger at the second voltage increased by 1 mV. If the same or substantially the same number of error parameter values does not result from the additional memory operations at the second supply voltage level (e.g., if more or less error parameter values are determined), the system may determine that the errors are inconsistent. In such circumstances, the Vdet module threshold may be set (or established) to a larger amount above the current threshold value. For example, the second voltage may be increased by 2 mV and the Vdet module associated with the memory device may be configured to trigger at the second voltage increased by 2 mV.

In some implementations, the Vdet module may include additional voltage detection devices. In such circumstances, additional threshold voltages for different memory devices or components may be established for the additional voltage detection devices of the Vdet module. To establish these additional threshold voltages, a supply voltage applied to the different memory component may be continuously reduced in a similar manner while monitoring the BER associated with the different component. When the BER is determined to be close enough to the BER threshold, the threshold voltage for that different component may be established at the current or some amount above the current supply voltage value in a similar manner as discussed above. In some implementations, each threshold device may include a companion threshold device for triggering different types of power loss events. As referred to herein, a companion threshold device is a device that is configured to trigger a first type of power loss event (e.g., one that initiates an error handling procedure) at one or more steps above the corresponding companion threshold device that is configured to trigger a second type of power loss event (e.g., one that initiates a power loss protection procedure).

In some implementations, after establishing the Vdet module threshold voltage(s) and manufacturing a set of memory devices with the established Vdet module threshold voltage(s), control circuitry (e.g., a controller of the Vdet module) may dynamically adjust the Vdet module threshold voltage(s). For example, the threshold voltage of the Vdet module may be increased or decreased during operation of the memory device. For example, control circuitry associated with the Vdet module may detect a Vdet trigger event (e.g., indicating a power loss event such as an error handling event). In response to detecting the Vdet trigger event, the control circuitry may determine whether the trigger event is a false positive. In some implementations, the control circuitry may perform the process for determining whether the trigger event is a false positive after detecting a threshold number of Vdet trigger events rather than in response to each Vdet trigger event. In such circumstances, the control circuitry may disregard power loss events indicated by one threshold device (e.g., for performing error handling) and may only respond to power loss events indicated by the companion threshold device (e.g., for performing a power loss protection procedure). As referred to herein, a false positive Vdet trigger event refers to the indication of a low supply power event by the Vdet module while the memory device is still at a safe or proper operating voltage. For example, a false positive may be determined if the Vdet triggers an event when the supply voltage falls below a Vdet threshold associated with the memory device (e.g., the supply voltage falls to 1.13V which is below a 1.14V Vdet threshold of the bus latches) but the BER of the memory device at the lower 1.13V is still above an allowable error threshold.

To determine whether the Vdet trigger event is a false positive, the control circuitry may reperform one or more memory operations (perform subsequent memory operations) that were performed just prior to detecting the trigger event. In some implementations, the control circuitry may perform a specific set or predetermined number of memory operations to determine whether the Vdet trigger event is a false positive. The control circuitry may also retrieve the error parameter value (e.g., BER) from the memory manager of the memory device of the last set or the last memory device operation. After performing the subsequent memory operations after detecting the Vdet trigger event, the control circuitry may compute or determine an error parameter value (e.g., BER) associated with performance of these subsequent memory operations. In response to determining that the error parameter value matches or is below the retrieved error parameter value, the control circuitry may determine that the Vdet trigger event was a false positive. The control circuitry may store this indication or update a metric representing a number of false positive Vdet trigger events. In some implementations, in response to determining that the Vdet trigger event was a false positive, the control circuitry may reduce or adjust the Vdet threshold voltage by one or two steps (and may also similarly reduce any companion Vdet threshold voltage by one or two steps). In some implementations, the control circuitry may reduce or adjust the Vdet threshold voltage by one or two steps after determining that a number of false positive Vdet trigger events that exceeds a threshold was detected.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. Such devices (e.g., mobile electronic devices) operate using a battery as a power supply voltage source. These batteries may drain over time and may provide supply voltages that are below the operating voltage of one of the components of the electronic devices (e.g., below the memory device operating voltage of the mobile device). In such cases, the electronic devices can become unstable and early detection of such low power or total power loss conditions enables data loss prevention. Vdet modules, described in this disclosure, can detect these supply voltage conditions, interrupt a controller or program to indicate the power loss condition to avoid data loss or to initiate an error handling procedure for determining whether to adjust the threshold voltage. The supply voltage at which the Vdet modules trigger such interrupts is referred to herein as the Vdet threshold voltage (or Vdet threshold supply voltage). Vdet modules monitor the Vcc and/or Vss supply voltages of one or more components in or associated with one or more memory devices but any other voltage source or voltage supply can be monitored.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 900 of FIG. 9. Data may be transferred between the memory device 110 and other components over an I/O bus that may include one or more latches for temporarily storing the data as it is being transferred (e.g., before being read or written from/to a memory array).

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits (and corresponding latches), lines, or interfaces to transfer data to or from the memory array 120. The memory controller 115 can include a memory manager 125 and an array controller 135.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an KC engine or other circuitry configured to detect or correct errors associated with writing data to or reading data from one or more memory cells of the memory device 110 coupled to the memory controller 115. KC component 140, for example, may detect or compute a bit-error-rate (BER) associated with performing a number of memory operations. The BER may correspond to bit errors occurring in latches of an I/O bus, internal errors of controller 115, errors occurring in one or more of the NAND arrays, or any one or more of the multi-level cell(s) (MLC) of the memory device 110. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. Array controller 135 may transmit detected BER information to memory manager 125 for storage and tracking.

The array controller 135 may include one or more Vdet module(s) 160. In some implementations, Vdet module(s) 160 may be off-chip, external and/or outside of controller 135. For example, Vdet module 160 may be an independent component coupled to one or more components in environment 100. For example, Vdet module 160 may be a separate device on a die on which memory device 110 is implemented. In cases where Vdet module(s) 160 is implemented outside of controller 135, Vdet module 160 may implement an ECC 140 or may communicate with ECC 140 or other components on the memory device to obtain error parameters (e.g., BER, content of status registers from the NAND, and any other data needed for measuring errors) of one or more components of memory device 110. An exemplary implementation of Vdet module 160 is described below in connection with FIG. 5.

In some implementations, the Vdet threshold voltage may be established when the given memory device 110 is being manufactured or may be configured after memory device 110 is manufactured. In such circumstances, memory device 110 may be initially configured to operate at a given supply voltage. The Vdet module 160 may be trained to trigger at a lowest or substantially lowest supply voltage based on performance of multiple memory operations on memory device 110 as discussed above. For example, Vdet module 160 may be initially set with a Vdet threshold voltage corresponding to the operating supply voltage of memory device 110. A supply voltage at or substantially above (e.g., 1 mV above) the Vdet threshold voltage may be provided to memory device 110. After performing multiple memory operations (e.g., writing and reading data to memory device 110 (e.g., latches associated with an I/O bus of memory device 110)), an error parameter (e.g., a BER) may be determined. If the error parameter is below the allowable error parameter threshold, the threshold voltage may be reduced. In some implementations, the threshold voltage may be set based on an output of a digital to analog converter (DAC). In such cases, the Vdet threshold voltage may be reduced by reducing the input to the DAC by one bit (e.g., one step) or two bit value (e.g., two steps) to a second supply voltage level. In addition, the supply voltage to memory device 110 may be reduced by the same or different amount. For example, if each step of the DAC corresponds to 1 mV, the supply voltage to the memory device 110 may be reduced by 1 mV as does the Vdet threshold voltage.

After the Vdet threshold voltage and memory device 110 supply voltage are reduced to a second supply voltage level, additional training may be performed to evaluate whether an error parameter threshold is exceeded by the error parameter value and to establish the threshold voltage of Vdet module 160. For example, multiple memory operations may be performed on memory device 110. After performing the multiple memory operations (e.g., writing and reading data to memory device 110 (e.g., latches associated with an I/O bus of memory device 110)) at the reduced second supply voltage level, a second error parameter (e.g., a BER) may be determined. For example, a module may track and accumulate the number of BER that occur each time or after a set of the multiple memory operations are performed while the memory device is operating at the second supply voltage level. The second error parameter may be compared to an allowable error parameter threshold (e.g., to check if the BER is below a number of correctable BER values). If the second error parameter is below the allowable error parameter threshold, the threshold voltage and the supply voltage may be further reduced below the second supply voltage level (e.g., by one or two DAC steps). If the second error parameter exceeds the allowable error parameter threshold, the Vdet module threshold may be set (or established) to one or two DAC steps above the current threshold value. In some implementations, the Vdet module threshold may be set to the last value at which the error parameter was below the allowable error threshold. Additionally, companion Vdet module thresholds that trigger different types of power loss events may be similarly adjusted and set.

In some implementations, after establishing the Vdet module threshold voltage (and corresponding companion threshold voltages) and manufacturing a set of memory device modules with the established Vdet module threshold voltage(s), control 135 or other control circuitry may dynamically adjust the Vdet module 160 threshold voltage. For example, the threshold voltage(s) of Vdet module 160 may be increased or decreased during operation of memory device 110. For example, control circuitry in or associated with Vdet module 160 (e.g., host 105 or control 135) may detect a Vdet trigger event (e.g., receive an interrupt from Vdet module 160 indicating a power loss event of the type that triggers an error handling procedure). In response to detecting the Vdet trigger event, the control circuitry may determine whether the trigger event is a false positive. In some implementations, in response to determining that the Vdet trigger event was a false positive, the control circuitry may reduce or adjust the Vdet threshold voltage by one or two steps. In some implementations, the control circuitry may reduce or adjust the Vdet threshold voltage by one or two steps after determining that a number of false positive Vdet trigger events that exceeds a threshold was detected. The control circuitry may also reduce or adjust any companion Vdet threshold voltage (that triggers a different type of power loss event) by the same amount.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection (e.g., bit-error-rate (BER) monitoring) or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, error parameter information, Vdet false positive event history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts (e.g., an error parameter) is above a threshold (e.g., an allowable error threshold), the bit error can be referred to as an uncorrectable bit error. The management tables 130 can maintain a count of correctable or uncorrectable bit errors, among other things. The management table 130 may also keep track, store and monitor a number of times a Vdet module 160 generated a trigger indicating a low supply voltage (e.g., a supply voltage below a Vdet threshold, a power loss event that triggers an error handling procedure, or a power loss event that triggers a power loss protection procedure) and/or the number of times such triggers were determined to be false positives. In particular, the management table 130 may also keep track, store and monitor a number of times a low supply voltage (e.g., a supply voltage below a Vdet threshold) triggered by Vdet module 160 was a false positive.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device. In some implementations, multiple Vdet modules 160 may be provided each with a different or same Vdet threshold value. Each Vdet module 160 may be included or associated with each memory cell or array 120 and may be configured with a different established Vdet threshold value (and corresponding respective companion threshold value). Each Vdet module 160 may include an independent control circuitry or process for dynamically updating the threshold value (and companion threshold value) when a given Vdet event or set of events are triggered.

Blocks of memory cells in NAND devices may be reconfigured during operation to work in SLC mode (for example, though not necessarily as cache), or any of multiple MLC modes. As a result, the allowable BER (e.g., the error parameter threshold monitored by Vdet module 160) may change during operation of the device. Such change in operation may cause the Vdet threshold to change. Particularly, different operating modes of the given memory device may influence the Vdet threshold voltage because different allowable BER thresholds may be associated with each mode. Particularly, in one mode the BER threshold may be higher than the BER threshold in another mode. For example, when the memory device is configured to operate in a first mode, during manufacturing the BER relative to the corresponding mode BER threshold may be determined as the supply voltage is reduced. In the first mode, the BER threshold may be greater than the BER threshold in a second mode and accordingly, the lowest supply voltage at which the BER threshold is not exceeded in the first mode may be greater than the lowest supply voltage at which the BER threshold is not exceeded in the second mode. As such, the threshold voltage for the first mode may be greater than the second mode. The Vdet module 160 may receive an indication from the memory device as to the current mode of operation and may configure the threshold voltage (and companion threshold voltage) based on the established threshold voltage associated with the given mode. Similarly, during operation the threshold voltage (and companion threshold voltage) may be adjusted based on an analysis of whether the BER corresponding to the given mode was exceeded when the power loss event was triggered.

Figure 2:
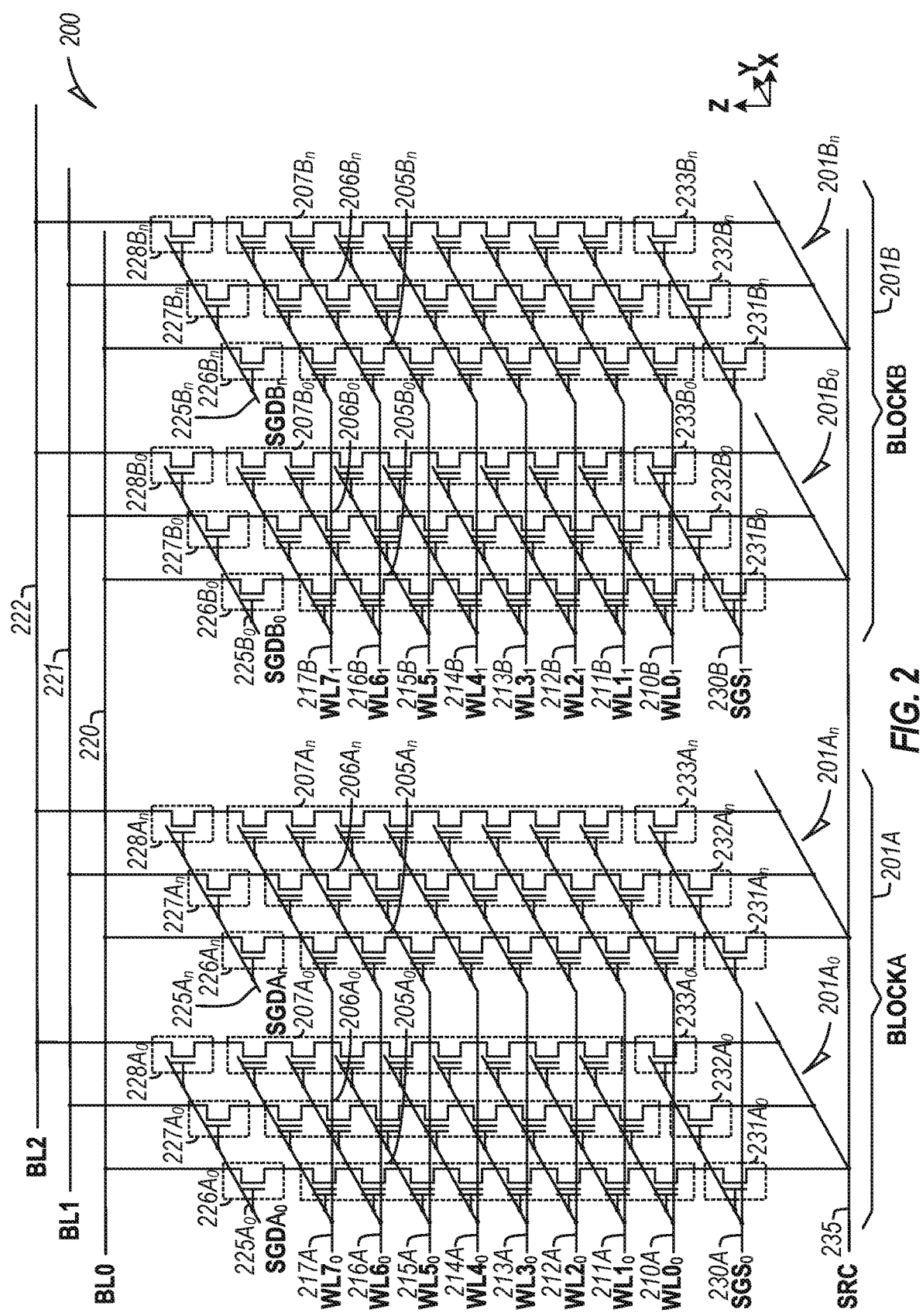
FIGS. 2-3 illustrate schematic diagrams of an example of a 3D NAND architecture semiconductor memory array upon which one or more embodiments may be implemented.

FIG. 2 illustrates an example schematic diagram of a 3D NAND architecture semiconductor memory array 200 including a number of strings of memory cells (e.g., first-third $A_0$ memory strings 205$A_0$-207$A_0$, first-third $A_n$ memory strings 205$A_n$-207$A_n$, first-third $B_0$ memory strings 205$B_0$-207$B_0$, first-third $B_n$ memory strings 205$B_n$-207$B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231$A_0$-233$A_0$, first-third $A_n$ SGS 231$A_n$-233$A_n$, first-third $B_0$ SGS 231$B_0$-233$B_0$, first-third $B_n$ SGS 231$B_n$-233$B_n$, etc.) and a drain-side select gate (SGD) (e.g., first-third $A_0$ SGD 226$A_0$-228$A_0$, first-third $A_n$ SGD 226$A_n$-228$A_n$, first-third $B_0$ SGD 226$B_0$-228$B_0$, first-third $B_n$ SGD 226$B_n$-228$B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). The illustrated device provided for purposes of description includes two blocks, each block having two sub-blocks, each sub-block having a single physical page, with each physical page having three strings of memory cells, and each string having 8 tiers of memory cells. In actual devices, the memory array 200 will typically include a much greater number of blocks, sub-blocks, physical pages, strings of memory cells, memory cells, and/or tiers. For example, each string of memory cells can include a selected number of tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) WL$0_0$-WL$7_0$ 210A-217A, WL$0_1$-WL$7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 226$A_0$-228$A_0$ can be accessed using an $A_0$ SGD line SGD$A_0$ 225$A_0$, first-third $A_n$ SGD 226$A_n$-228$A_n$ can be accessed using an $A_n$ SGD line SGD$A_n$ 225$A_n$, first-third $B_0$ SGD 226$B_0$-228$B_0$ can be accessed using an $B_0$ SGD line SGD$B_0$ 225$B_0$, and first-third $B_n$ SGD 226$B_n$-228$B_n$ can be accessed using an $B_n$ SGD line SGD$B_n$ 225$B_n$. First-third $A_0$ SGS 231$A_0$-233$A_0$ and first-third $A_n$ SGS 231$A_n$-233$A_n$ can be accessed using a gate select line SGS$_0$ 230A, and first-third $B_0$ SGS 231$B_0$-233$B_0$ and first-third $B_n$ SGS 231$B_n$-233$B_n$ can be accessed using a gate select line SGS$_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
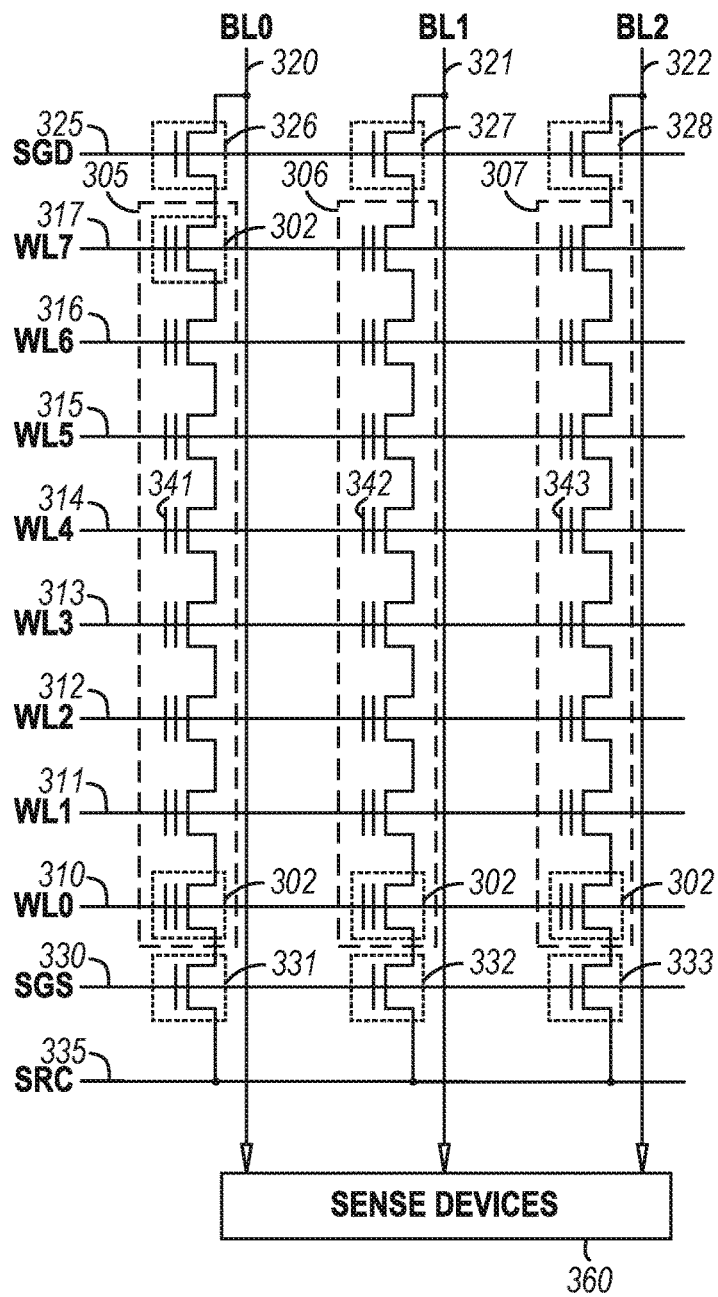

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

In some implementations, Vdet module 160 may be coupled to receive the programming voltage and determine whether such voltage falls below the Vdet threshold specifically associated with the programming voltage. A given Vdet module 160 may include multiple threshold detection circuitries or processes each coupled to receive a different voltage value (e.g., Vpgm, Vss, and Vpass). Alternatively, multiple Vdet modules 160 may be provided each associated with a different voltage value (e.g., one module 160 associated with Vpgm and another module 160 associated with Vss). Each of the threshold detection circuitries or processes may be configured or established with a different threshold value based on the minimum power value associated with or needed to safely and properly operate the given voltage line (e.g., Vpgm and Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line. Sense amplifiers 360 may determine whether a state of a given memory cell or set of cells is unstable. In such circumstances, sense amplifiers 360 may record this instability as an error parameter. Sense amplifiers 360 may communicate with a controller to correct the error parameter.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
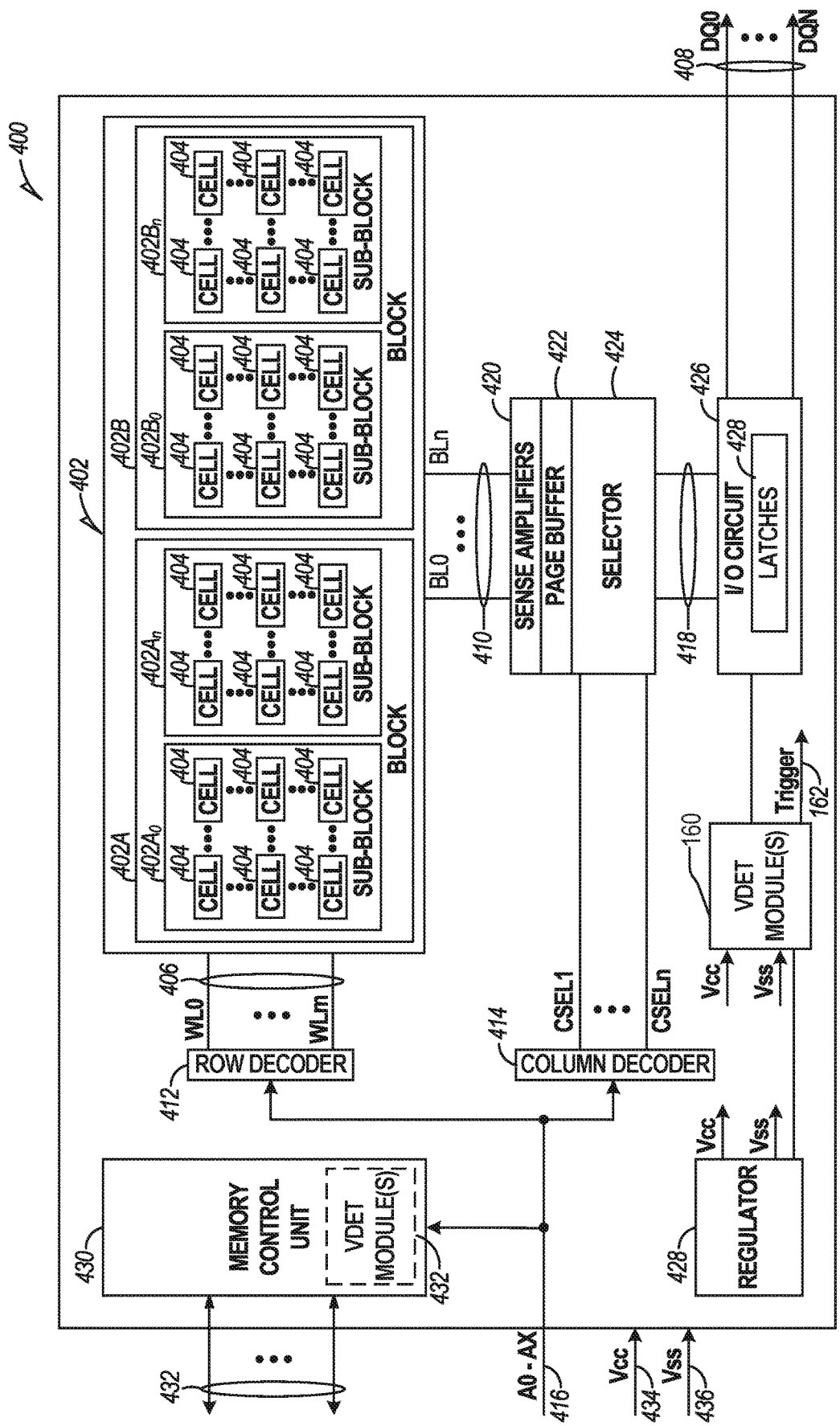
FIG. 4 illustrates an example block diagram of a memory module upon which one or more embodiments may be implemented.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4. In some implementations, memory control unit 430 may include a Vdet module 433 that implements the same functions as Vdet module 160 (FIG. 1). Vdet module 433 may be configured to trigger a power loss event (of different types triggering an error handling procedure or triggering a power loss protection procedure) in response to detecting power received by memory control unit 430 falls below a threshold (resulting in an error handling procedure being triggered) (or companion threshold resulting in a power loss protection procedure being triggered) established for Vdet module 433.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. For example, I/O circuit 426 may include one or more latches 429 for temporarily storing data to be written to memory array 402 and data to be read by the one or more external devices from memory array 402. The page buffer 422 can store data received from the one or more devices external to the memory device 400 before the data is programmed into relevant portions of the memory array 402, or can store data read from the memory array 402 before the data is transmitted to the one or more devices external to the memory device 400.

Latches 429 may be configured to operate at a minimum supply voltage value. Vdet module 160 may monitor the supply voltage value of latches 429 and generate a trigger 162 when the supply voltage value of latches 429 falls below the threshold established for Vdet module 160. Trigger 162 may be provided to memory control unit 430 and/or any one or more external devices or applications. In case Vdet module 160 detects a power loss event (e.g., when supply voltage value of latches 429 falls below the threshold (or companion threshold) established for Vdet module 160), Vdet module 160 may reperform or perform a set of memory operations using latches 429 (with or without transferring the data to memory array 402) to determine whether the power loss event was a false positive. If a number of false positive events were detected, Vdet module 160 may dynamically reduce the established threshold voltage by one or two steps (or by any other suitable voltage value). In some implementations, the process for determining whether the power loss event was a false positive may be performed in response to a trigger from a first threshold device of Vdet module 160 that is set to be slightly greater than a companion second threshold device of Vdet module 160. In some implementations, the process for determining whether the power loss event was a false positive may be performed in response to receiving a threshold number of triggers from a first threshold device of Vdet module 160 that is set to be slightly greater than a companion second threshold device of Vdet module 160. The process for performing power loss protection may be triggered in response to a power loss event indicated by the companion second threshold device of Vdet module 160.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals. Vdet module 160 may be coupled to regulator 428 to monitor any number of supply voltages (e.g., Vcc and/or Vss) to determine whether such voltages fall below an established Vdet threshold (or a companion threshold voltage).

Figure 5:
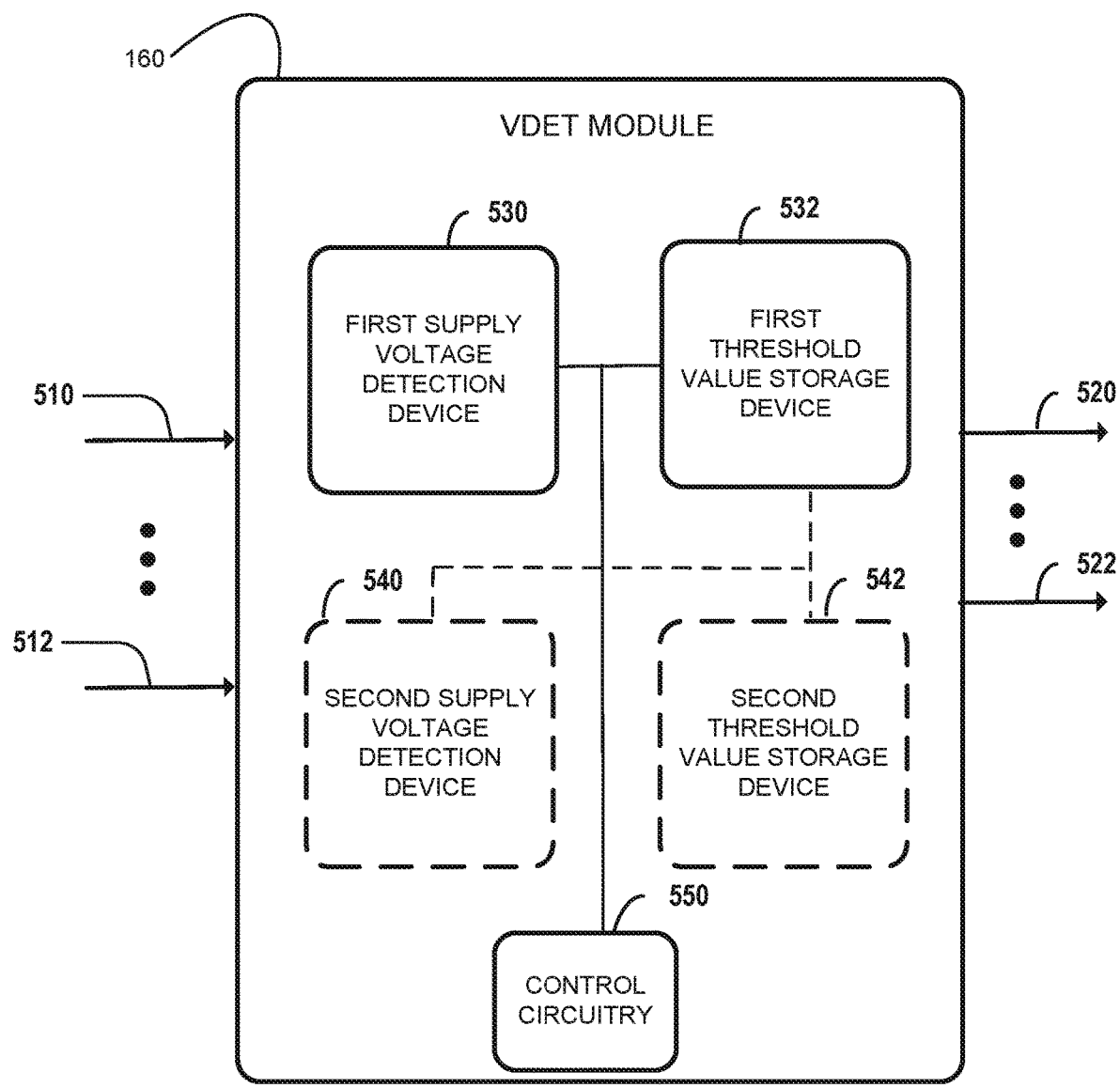
FIG. 5 is a block diagram illustrating an example of a Vdet module upon which one or more embodiments may be implemented.

FIG. 5 is a block diagram illustrating an example of Vdet module 160 upon which one or more embodiments may be implemented. Vdet module 160 includes a first supply voltage detection device 530, a first threshold value storage device 532, control circuitry 550, and may optionally include one or more second supply voltage detection devices 540 (e.g., companion voltage detection device) and second threshold value storage device 542 (as indicated by the dotted lines). First supply voltage detection device 530 may be coupled to an input supply voltage 510. For example, first supply voltage detection device 530 may be coupled to Vcc or Vss output of regulator 528 or may be coupled to the power supply of memory device 110 (e.g., latches 429 of the memory device). First threshold value storage device 532 may store a current voltage threshold value or a table of voltage threshold values for a given supply voltage device to be monitored. For example, first threshold value storage device 532 may store one supply voltage value for a memory device that operates in one mode and a different second supply voltage value for a memory device that operates in a second mode. Additionally, first threshold value storage device 532 may store in the index different supply voltage values depending on what device of memory device 110 is providing supply voltage 510 (e.g., depending on what supply voltage is being monitored). Control circuitry 550 may detect the current mode of operation of memory device 110 or may determine what device is providing the supply voltage 510 and may in response select the supply voltage for output from first threshold value storage device 532.

First supply voltage detection device 530 may include a comparator circuit that compares the input supply voltage 510 to the supply voltage value output by first threshold value storage device 532. In response to determining that the input supply voltage 510 is less than the supply voltage value output by first threshold value storage device 532, first supply voltage detection device 530 may send a trigger or communicate a trigger (e.g., indicating a power loss event such as a power loss event that initiates an error handling procedure or a power loss even that initiates a power loss protection procedure) to control circuitry 550. In response to receiving the trigger from first supply voltage detection device 530, control circuitry 550 may perform process 600-800 (FIGS. 6-8) to determine whether to dynamically adjust the value current selected that is stored in first threshold value storage device 532. For example, control circuitry 550 may perform a process described above and below to determine whether the power loss event is a false positive and if so to reduce the value stored in first threshold value storage device 532. In some implementations, control circuitry 550 may only perform the process to determine whether the power loss event was a false positive after a certain threshold number of similar triggers were received. For example, control circuitry 550 may retrieve an error parameter (e.g., BER, NAND register information or contents, or other data from other memory device components) from the memory device 110 being monitored or from which the supply voltage 510 is being received. If the error parameter does not exceed an error parameter threshold value (which may also be stored in device 532), control circuitry 550 may determine that the power loss event was a false positive and may reduce the value stored in device 532 (and the value stored in a companion device). In another example, control circuitry 550 may reduce a power supply voltage of memory device 110 and monitor the error parameter of the memory device 110 to determine whether the error parameter exceeds a threshold value. If the error parameter does not exceed the threshold value, control circuitry 550 may further reduce the supply voltage to the memory device and may also reduce the threshold value stored in device 532 (and the value stored in a companion device). Control circuitry 550 may continue reducing the supply voltage until the error parameter exceeds the threshold value and may then set or update the supply voltage threshold value stored in device 532 to the currently set supply voltage of the memory device (optionally increased by one or two steps). To monitor the error parameter, control circuitry 550 may perform one or more memory device operations by transmitting data over output 522 and a corresponding read/write command. Control circuitry 550 may read back the data sent over output 522 via input 512 and determine the BER of the data based on a number of errors in the data that is read back in comparison to the data that was sent out over output 522. In another example, input 512 may be coupled to an ECC controller of memory device 110 and may indicate the current BER of a given device (e.g., latches of the memory device 110). Control circuitry 550 may use this value to determine whether the BER of the last operation performed on memory device 110 (before first supply voltage detection device 530 triggered or indicated a power loss event) exceeded the BER threshold.

In some implementations, control circuitry 550 may issue an interrupt 520 to a host controller or another external component indicating a power loss event. In some implementations, one or more additional second supply voltage detection devices 540 may be provided in Vdet module 160 to monitor the supply voltage of one or more second memory devices while first supply voltage detection device 530 monitors the supply voltage of memory device 110. Control circuitry 550 may similarly select for output the threshold voltage(s) from second threshold value storage device 542 depending on the memory device being monitored by second supply voltage detection device 540 for comparison with the supply voltage being input to second supply voltage detection device 540. Similarly, control circuitry 550 may dynamically update the threshold voltage value stored in device 542 using processes 600-800 based on the BER of the data being operated on in the memory device being monitored.

Second supply voltage detection devices 540 may correspond to companion voltage detection devices to first supply voltage detection device 530. In cases where second supply voltage detection devices 540 are companion devices, the voltages monitored by second voltage detection device 540 may be identical to those monitored by first supply voltage detection device 530. As such, the same voltage supply input may be coupled to both the first and second voltage detection devices 530/540. The values stored in storage device 542 may be one or two steps below the value stored in storage device 532. Also, second supply voltage detection devices 540 may be configured to trigger a power loss event that is of a different type than the power loss even triggered by first supply voltage detection device 530. For example, first supply voltage detection device 530 may trigger a first power loss event corresponding to an error handling procedure and second supply voltage detection devices 540 may trigger a second power loss event corresponding to a power loss protection procedure.

Figure 6:
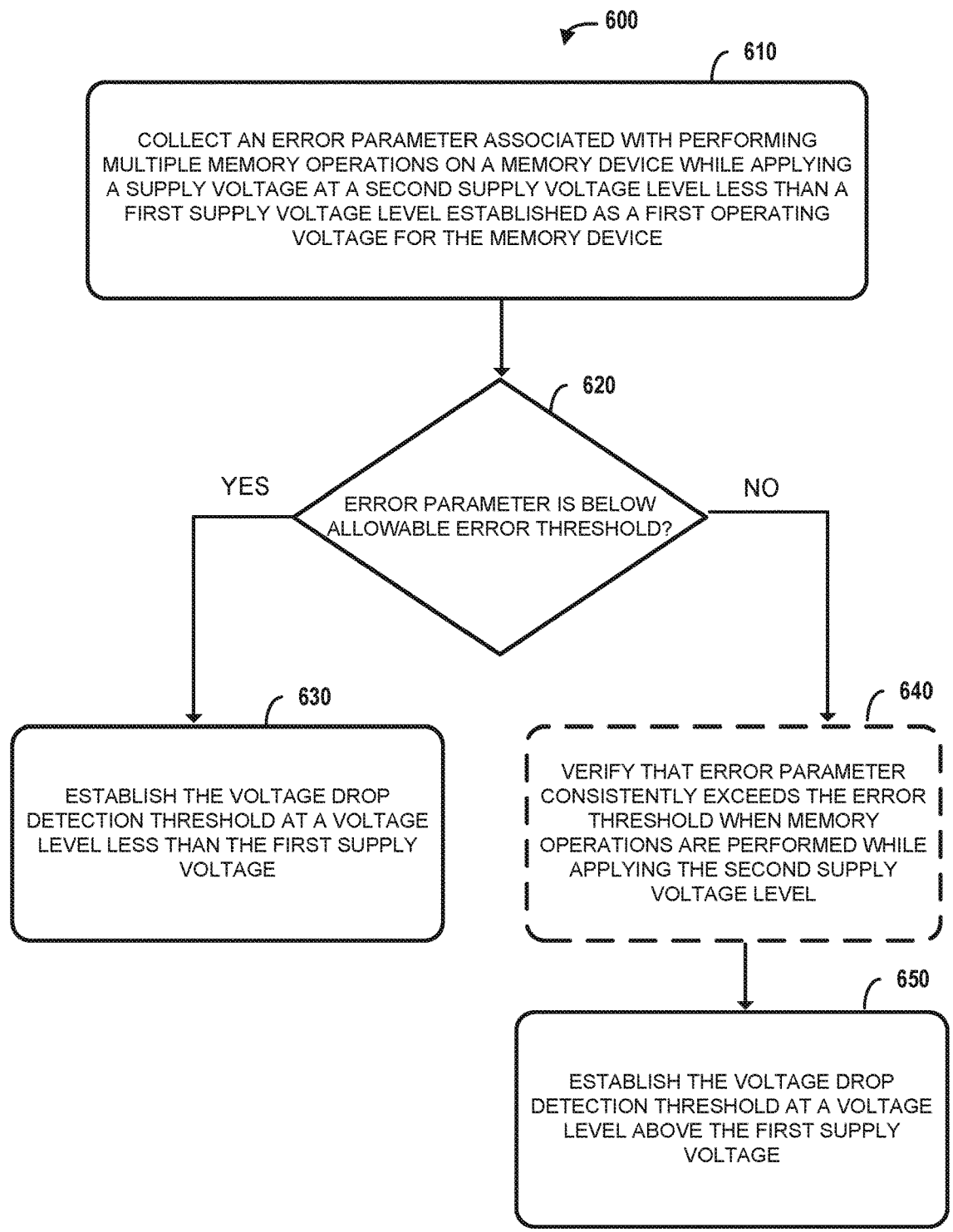
FIG. 6 is a flow chart of a process for setting a Vdet threshold value upon which one or more embodiments may be implemented.

FIG. 6 is a flow chart of an example process 600 for setting a Vdet threshold value upon which one or more embodiments may be implemented. At 610, an error parameter is collected associated with performing multiple memory operations on a memory device while applying a supply voltage at a second supply voltage less than a first supply voltage level established as a first operating voltage for the memory device. For example, during device manufacture of a given memory device, the Vdet voltage threshold may be determined and established by analyzing a BER of multiple operations (e.g., read/write memory operations) being performed while the memory device is provided with a supply voltage that is below the safe operating voltage of the memory device. In another example, during device operation, when a Vdet power event is triggered, multiple memory operations may be performed at the current voltage level to determine the BER and whether the Vdet event is a false positive.

At 620, a determination is made as to whether the error parameter is below an allowable error threshold. In response to determining that the error parameter is below the error threshold, the process proceeds to step 630; otherwise the process proceeds to step 640. For example, control circuitry may compare the BER with a BER threshold value. The BER threshold value may indicate a BER that corresponds to correctable errors. If the BER is below the allowable threshold, the errors may be correctable and therefore be a safe operating condition for the memory device. The BER may be determined based on an KC computation.

At 630, the voltage drop detection threshold (e.g., the Vdet threshold) is established at a voltage level less than the first supply voltage. For example, the control circuitry may store or update a Vdet threshold in Vdet module 160.

At 640, a verification is performed that the error parameter consistently exceeds the error threshold when memory operations are performed while applying the second supply voltage level. This step may be omitted as indicated by the dotted lines in the drawing. For example, the control circuitry may perform additional memory operations to determine whether the BER continues to exceed the BER threshold to determine and address noise (e.g., in some cases the BER may have been found to be below the threshold because of noise). If the BER continues to exceed the threshold, control circuitry may determine that the BER exceeding the threshold is not due to noise in the system and may set or change or establish the threshold of the Vdet module 160 to be 1 step above the current voltage supply. If the BER does not continue to exceed the threshold, control circuitry may determine that the BER is due to noise in the system and may set or change or establish the threshold of the Vdet module 160 to be 2 steps above the current voltage supply.

At 650, the voltage drop detection threshold (and companion threshold) is established at a voltage level above the first supply voltage. For example, the control circuitry may set or change or establish the Vdet threshold of module 160 to be one or two steps above the current supply voltage or the supply voltage determined to be the safe operating voltage of the memory device.

Figure 7:
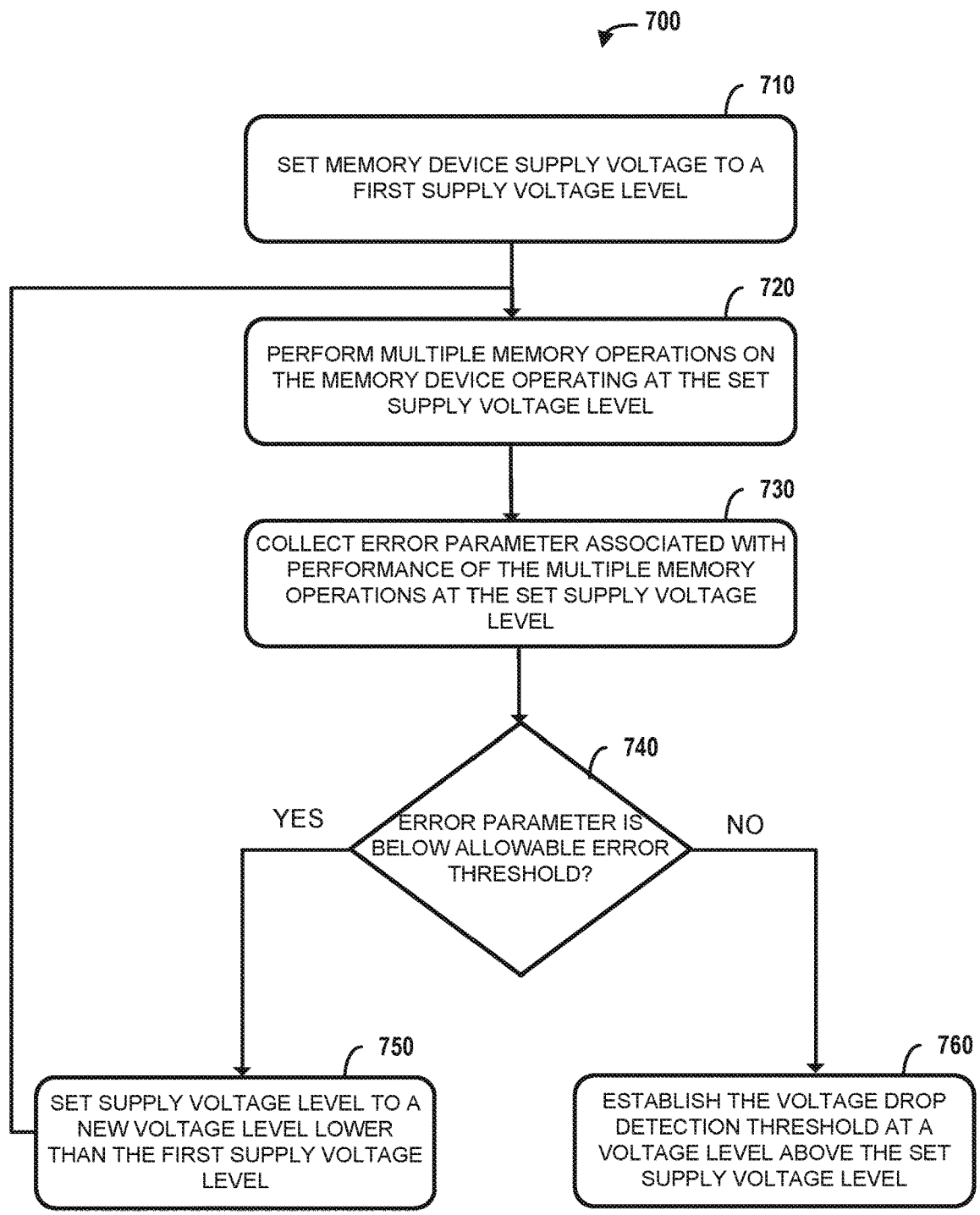
FIG. 7 is a flow chart of a process for establishing a Vdet threshold value upon which one or more embodiments may be implemented.

FIG. 7 is a flow chart of a process 700 for establishing a Vdet threshold value upon which one or more embodiments may be implemented. At 710, a memory device supply voltage is set to a first supply voltage level. For example, the control circuitry may set the memory device to operate at a voltage level indicated to be the safe operating conditions for the memory device.

At 720, multiple memory operations are performed on the memory device operating at the set supply voltage level. For example, the control circuitry may read and write multiple data to the memory device (or may read and write multiple data to latches without writing or reading from the memory array).

At 730, an error parameter is collected associated with performing the multiple memory operations on a memory device operating at the set supply voltage level. For example, the control circuitry may determine the BER for the data being written and read from the memory device or latches of the memory device.

At 740, a determination is made as to whether the error parameter is below an allowable error threshold. In response to determining that the error parameter is below the error threshold, the process proceeds to step 750; otherwise the process proceeds to step 760. For example, control circuitry may compare the BER with a BER threshold value. The BER threshold value may indicate a BER that corresponds to correctable errors. If the BER is below the allowable threshold, the errors may be correctable and therefore be a safe operating condition for the memory device. The BER may be determined based on an KC computation.

At 750, the supply voltage level is set to a new voltage level lower than the first supply voltage level. For example, the control circuitry may reduce the operating supply voltage of a regulator providing supply voltage to one or more components of the memory device. The new voltage level may be one or two steps below the current supply voltage level.

At 760, the voltage drop detection threshold is established at a voltage level above the set supply voltage level. For example, the control circuitry may set or change or establish the Vdet threshold (and companion voltage threshold) of Vdet module 160 to be one or two steps above the current supply voltage (and two or three steps above for the companion voltage threshold) or the supply voltage determined to be the safe operating voltage of the memory device.

Figure 8:
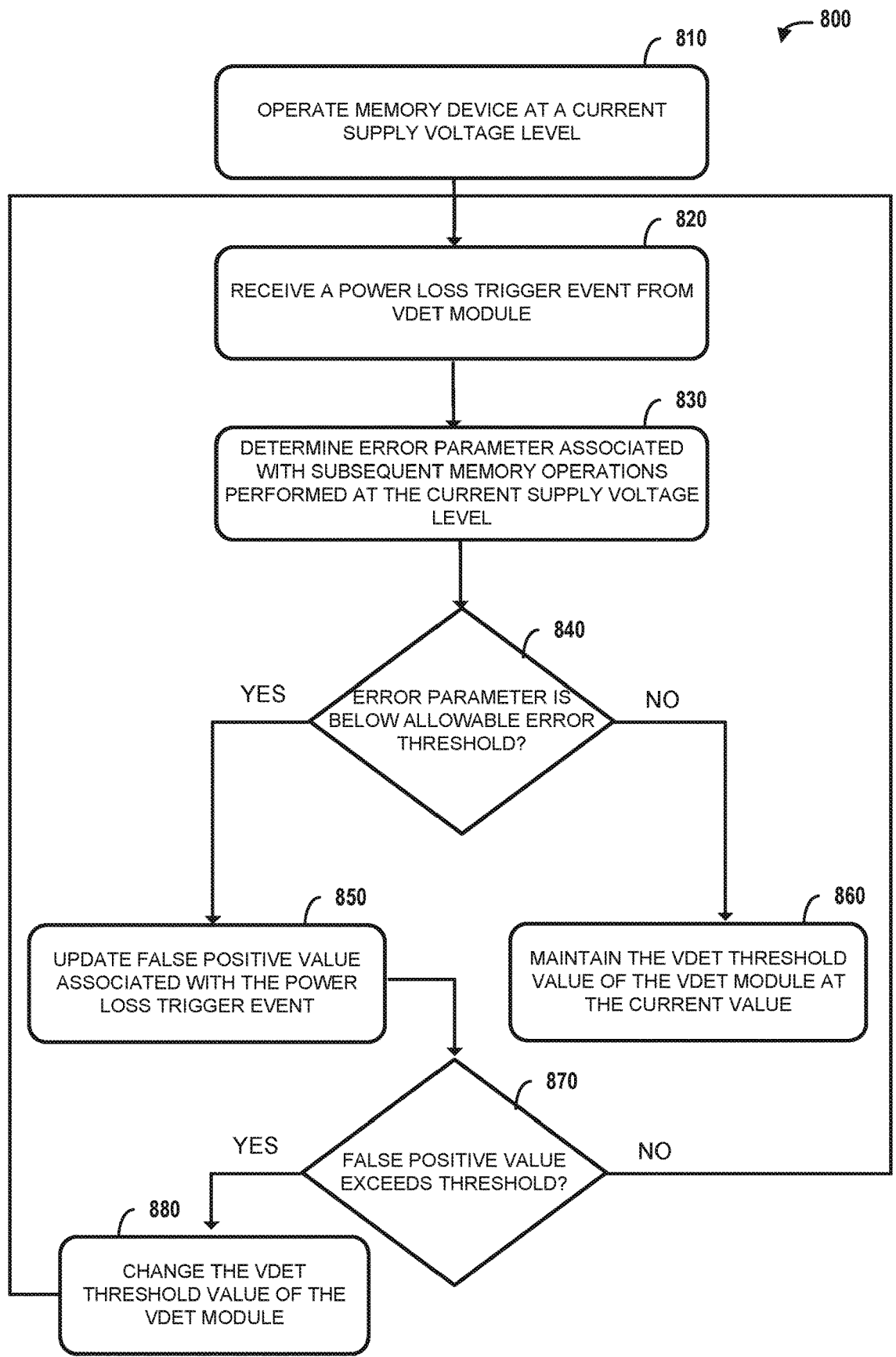
FIG. 8 is a flow chart of a process for dynamically updating a Vdet threshold value upon which one or more embodiments may be implemented.

FIG. 8 is a flow chart of a process 800 for dynamically updating a Vdet threshold value upon which one or more embodiments may be implemented. At 810, a memory device is operated at a current supply voltage level. For example, the control circuitry may operate the memory device at the supply voltage level of the regulator.

At 820, a power loss trigger event is received from a Vdet module. For example, Vdet module 160 may detect that a current power supply value of a component of the memory device (e.g., latches of the memory device) is below the Vdet threshold value.

At 830, an error parameter associated with performing subsequent memory operations at the current supply voltage level is determined. For example, the control circuitry may perform additional memory operations at the current voltage supply value and compute a BER of these memory operations.

At 840, a determination is made as to whether the error parameter is below an allowable error threshold. In response to determining that the error parameter is below the error threshold, the process proceeds to step 850; otherwise the process proceeds to step 860. For example, control circuitry may compare the BER with a BER threshold value. The BER threshold value may indicate a BER that corresponds to correctable errors. If the BER is below the allowable threshold, the errors may be correctable and therefore be a safe operating condition for the memory device. The BER may be determined based on an ECC computation.

At 850, a false positive value associated with the power loss trigger event is updated. For example, the control circuitry may determine that because the BER is below the BER threshold value and because the power loss trigger event was still detected, the power loss trigger was a false positive (e.g., because the memory device can in fact safely operate at the supply voltage level that caused the power loss trigger event to be triggered).

At 860, the Vdet threshold value of the Vdet module is maintained at the current value.

At 870, a determination is made as to whether the false positive value exceeds a threshold. In response to determining that the false positive value exceeds the threshold, the process proceeds to step 880; otherwise the process proceeds to step 820. For example, the control circuitry may retrieve from management 125 a false positive threshold value and determine whether the current false positive value (as updated to reflect the latest false positive event) exceeds the threshold value.

At 880, the Vdet threshold value of the Vdet module is changed. For example, the control circuitry may set or change or establish the Vdet threshold (and companion threshold) of module 160 to be one or two steps (or for the companion two or three steps) below the current Vdet threshold value (and companion threshold value).

Processes 600-800 may be performed by any control circuitry or may be performed by dedicated circuitry. Any step in process 600-800 may be performed out of the sequence represented in FIGS. 6-8 or may be entirely omitted.

Figure 9:
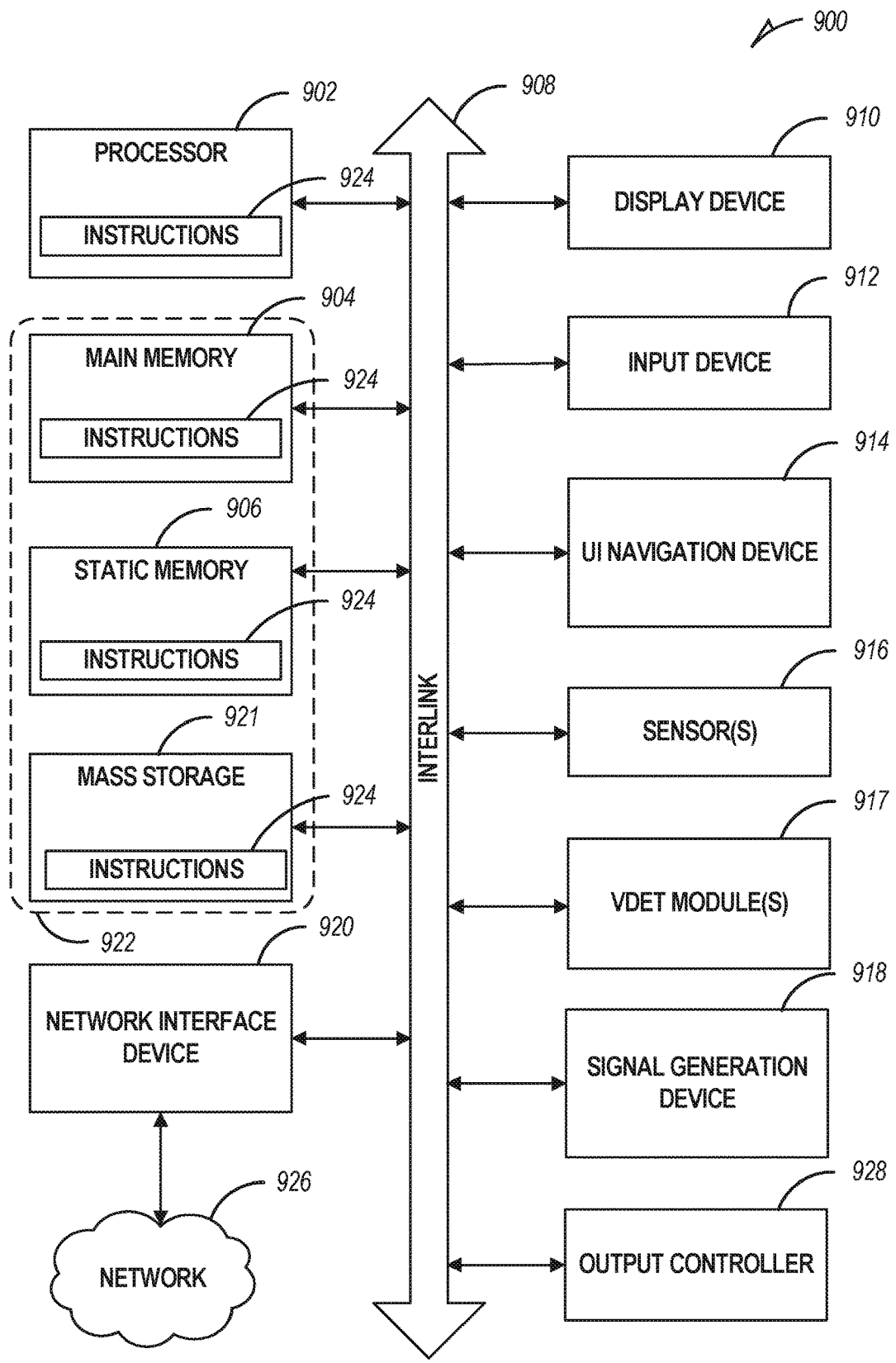
FIG. 9 is a block diagram illustrating an example of a machine upon which one or more embodiments may be implemented.

FIG. 9 illustrates a block diagram of an example machine 900 upon which any one or more of the techniques (e.g., methodologies) discussed herein may perform. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 900 (e.g., the host device 105, the memory device 110, etc.) may include a hardware processor 902 (e.g., a central processing unit (CPU), a graphics processing unit (GPU), a hardware processor core, or any combination thereof, such as the memory controller 115, etc.), a main memory 904 and a static memory 906, some or all of which may communicate with each other via an interlink (e.g., bus) 908. The machine 900 may further include a display unit 910, an alphanumeric input device 912 (e.g., a keyboard), and a user interface (UI) navigation device 914 (e.g., a mouse). In an example, the display unit 910, input device 912 and UI navigation device 914 may be a touch screen display. The machine 900 may additionally include a storage device (e.g., drive unit), a signal generation device 918 (e.g., a speaker), a network interface device 920, one or more sensors 916, such as a global positioning system (GPS) sensor, compass, accelerometer, or other sensor, and one or more Vdet module(s) 917 (e.g., Vdet module(s) 160). The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device may constitute the machine readable medium 922.

While the machine readable medium 922 is illustrated as a single medium, the term "machine readable medium" may include a single medium or multiple media (e.g., a centralized or distributed database, or associated caches and servers) configured to store the one or more instructions 924.

The term "machine readable medium" may include any transitory or non-transitory medium that is capable of storing, encoding, or carrying transitory or non-transitory instructions for execution by the machine 900 and that cause the machine 900 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 (e.g., software, programs, an operating system (OS), etc.) or other data are stored on the storage device 921, can be accessed by the memory 904 for use by the processor 902. The memory 904 (e.g., DRAM) is typically fast, but volatile, and thus a different type of storage than the storage device 921 (e.g., an SSD), which is suitable for long-term storage, including while in an "off" condition. The instructions 924 or data in use by a user or the machine 900 are typically loaded in the memory 904 for use by the processor 902. When the memory 904 is full, virtual space from the storage device 521 can be allocated to supplement the memory 904; however, because the storage 921 device is typically slower than the memory 904, and write speeds are typically at least twice as slow as read speeds, use of virtual memory can greatly reduce user experience due to storage device latency (in contrast to the memory 904, e.g., DRAM). Further, use of the storage device 921 for virtual memory can greatly reduce the usable lifespan of the storage device 921.

In contrast to virtual memory, virtual memory compression (e.g., the Linux® kernel feature "ZRAM") uses part of the memory as compressed block storage to avoid paging to the storage device 921. Paging takes place in the compressed block until it is necessary to write such data to the storage device 921. Virtual memory compression increases the usable size of memory 904, while reducing wear on the storage device 921.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 924 may further be transmitted or received over a communications network 926 using a transmission medium via the network interface device 920 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 920 may include one or more physical jacks (e.g., Ethernet, coaxial, or phone jacks) or one or more antennas to connect to the communications network 926. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, control circuitry, a digital signal processor (DSP), or any other type of processor or processing circuit, including a group of processors or multi-core devices.

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell or performing a memory (or memory device) operation, as used herein, includes reading from, writing to, or erasing the memory cell or memory (or memory device). The operation of placing a memory cell in an intended state is referred to herein as "programming," and can include both writing to or erasing from the memory cell (e.g., the memory cell may be programmed to an erased state).

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

It will be understood that the term module (e.g., Vdet module) can refer to any combination of software and circuitry to perform or configured to perform the described function. Module may refer to a programmable device, non-programmable device, ASIC, PLD, FGPA, or other dedicated or specific circuitry or hardware element configured to perform the described function. Module may refer to software (e.g., computer readable instruction(s), code or a program running on a computer or processor or control circuitry) configured to perform the described function.

Method examples described herein can be machine or computer-implemented at least in part. Some examples can include a transitory or non-transitory computer-readable medium or machine-readable medium encoded with transitory or non-transitory instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times.

Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Examples

An example (e.g., "Example 1") of subject matter (e.g., a method or system) can include a method for dynamically establishing a voltage drop detection threshold of a memory device, wherein a power loss event is triggered when a supply voltage falls below the voltage drop detection threshold, wherein the establishing comprises: collecting an error parameter associated with performing multiple memory operations on the memory device, wherein the multiple memory operations are performed while applying a supply voltage at a second supply voltage level of the memory device which is less than a first supply voltage level established as a first operating voltage for the memory device; determining whether the error parameter is below an allowable error threshold; and in response to determining that the error parameter is below the allowable error threshold, establishing the voltage drop detection threshold at a voltage level less than the first supply voltage level.

In Example 2, the subject matter of Example 1 can optionally be configured such that the voltage drop detection threshold is established at the second supply voltage level.

In Example 3, the subject matter of Example 1 can optionally be configured such that the voltage drop detection threshold is established at a voltage level between the first supply voltage level and the second supply voltage level, wherein the voltage level is one or two digital-to-analog converter steps lower than the first supply voltage level.

In Example 4, the subject matter of Example 1 can optionally be configured for establishing an initial voltage drop detection threshold of the memory device in reference to the first supply voltage level established as the first operating voltage for the memory device, wherein the establishing of the voltage drop detection threshold at the voltage level less than the first supply voltage level comprises changing the initial voltage drop detection threshold.

In Example 5, the subject matter of Example 1 can optionally be configured for performing multiple initial memory operations on the memory device while applying the first operating voltage at the first supply voltage level before the collecting of the error parameter in response to memory operations performed while applying the supply voltage at the second supply voltage level.

In Example 6, the subject matter of Example 1 can optionally be configured such that the memory device comprises a NAND storage device, wherein the error parameter represents data bus errors of the memory device, and wherein collecting the error parameter comprises assessing a bit-error-rate associated with reading back data from NAND latches of the NAND storage device.

In Example 7, the subject matter of Example 1 can optionally be configured for detecting a power loss event that occurs when a given memory operation is being performed; determining a given error parameter associated with performing the given memory operation again after the power loss event; in response to determining that the given error parameter is below the allowable error threshold, updating a false positive trigger statistic; and in response to determining that the given error parameter exceeds the allowable error threshold, maintaining the established voltage drop detection threshold at the voltage level.

In Example 8, the subject matter of Example 7 can optionally be configured for in response to determining the false positive trigger statistic exceeds a false positive trigger threshold, changing the established voltage drop detection threshold.

In Example 9, the subject matter of Example 1 can optionally be configured for in response to determining that the error parameter exceeds the allowable error threshold: collecting a second error parameter associated with performing of the multiple memory operations while applying the supply voltage at the second supply voltage level; determining whether the second error parameter exceeds the allowable error threshold; in response to determining the second error parameter exceeds the allowable error threshold, establishing the voltage drop detection threshold at a voltage level greater than the second supply voltage level by a first amount; and in response to determining the second error parameter is below the allowable error threshold, establishing the voltage drop detection threshold at a voltage level greater than the second supply voltage level by a second amount, the second amount being greater than the first amount.

In Example 10, the subject matter of Example 1 can optionally be configured such that the memory device is configured to operate in a multiple of modes, wherein the voltage drop detection threshold is a first voltage drop detection threshold, further comprising associating the first voltage drop detection threshold with a first of the multiple modes and establishing a second voltage drop detection threshold for a second of the multiple modes.

An example (e.g., "Example 11") of subject matter (e.g., a method or system) can include a system comprising control circuitry configured for dynamically establishing a voltage drop detection threshold of a memory device, wherein a power loss event is triggered when a supply voltage falls below the voltage drop detection threshold, wherein the establishing comprises: collecting an error parameter associated with performing multiple memory operations on the memory device, wherein the multiple memory operations are performed while applying a supply voltage at a second supply voltage level of the memory device which is less than a first supply voltage level established as a first operating voltage for the memory device; determining whether the error parameter is below an allowable error threshold; and in response to determining that the error parameter is below the allowable error threshold, establishing the voltage drop detection threshold at a voltage level less than the first supply voltage level.

In Example 12, the subject matter of Example 11 can optionally be configured such that the voltage drop detection threshold is established at the second supply voltage level.

In Example 13, the subject matter of Example 11 can optionally be configured such that the voltage drop detection threshold is established at a voltage level between the first supply voltage level and the second supply voltage level, wherein the voltage level is one or two digital-to-analog converter steps lower than the first supply voltage level.

In Example 14, the subject matter of Example 11 can optionally be configured for the control circuitry to establish an initial voltage drop detection threshold of the memory device in reference to the first supply voltage level established as the first operating voltage for the memory device, wherein the establishing of the voltage drop detection threshold at the voltage level less than the first supply voltage level comprises changing the initial voltage drop detection threshold.

In Example 15, the subject matter of Example 11 can optionally be configured for the control circuitry to perform multiple initial memory operations on the memory device while applying the first operating voltage at the first supply voltage level before the collecting of the error parameter in response to memory operations performed while applying the supply voltage at the second supply voltage level.

In Example 16, the subject matter of Example 11 can optionally be configured such that the memory device comprises a NAND storage device, wherein the error parameter represents data bus errors of the memory device, and wherein collecting the error parameter comprises assessing a bit-error-rate associated with reading back data from NAND latches of the NAND storage device.

In Example 17, the subject matter of Example 11 can optionally be configured for the control circuitry to detect a power loss event that occurs when a given memory operation is being performed; determine a given error parameter associated with performing the given memory operation again after the power loss event; in response to determining that the given error parameter is below the allowable error threshold, update a false positive trigger statistic; and in response to determining that the given error parameter exceeds the allowable error threshold, maintain the established voltage drop detection threshold at the voltage level.

In Example 18, the subject matter of Example 17 can optionally be configured for the control circuitry to in response to determining the false positive trigger statistic exceeds a false positive trigger threshold, change the established voltage drop detection threshold.

In Example 19, the subject matter of Example 11 can optionally be configured for the control circuitry to in response to determining that the error parameter exceeds the allowable error threshold: collect a second error parameter associated with performing of the multiple memory operations while applying the supply voltage at the second supply voltage level; determine whether the second error parameter exceeds the allowable error threshold; in response to determining the second error parameter exceeds the allowable error threshold, establish the voltage drop detection threshold at a voltage level greater than the second supply voltage level by a first amount; and in response to determining the second error parameter is below the allowable error threshold, establish the voltage drop detection threshold at a voltage level greater than the second supply voltage level by a second amount, the second amount being greater than the first amount.

In Example 20, the subject matter of Example 11 can optionally be configured such that the memory device is configured to operate in a multiple of modes, wherein the voltage drop detection threshold is a first voltage drop detection threshold, further comprising associating the first voltage drop detection threshold with a first of the multiple modes and establishing a second voltage drop detection threshold for a second of the multiple modes.

An example (e.g., "Example 21") of subject matter (e.g., a system or apparatus) can optionally combine any portion or combination of any portion of any one or more of Examples 1-20 to include "means for" performing any portion of any one or more of the functions or methods of Examples 1-20, or a "machine-readable medium" (e.g., non-transitory, etc.) including instructions that, when performed by a machine, cause the machine to perform any portion of any one or more of the functions or methods of Examples 1-20.

As referred to herein, the term "system" should be understood to cover generically any one of or combination of the components, modules, apparatus or devices discussed in this disclosure and shown in FIGS. 1-5 and 9. For example, the term system may include a memory device, a memory system, a computer system, a memory module, a machine, an electronic device, a host and/or any combination thereof.

The above description is intended to be illustrative, and not restrictive. The scope of the invention should be determined with reference to the appended claims, along with the full scope of equivalents to which such claims are entitled.

The invention claimed is:

1. A method of operating a memory device, comprising:
performing a first memory operation on the memory device through use of a supply voltage established at a first voltage level;
determining a first error parameter associated with the first memory operation;
determining whether the error parameter is below an allowable error threshold;
in response to determining that the error parameter is below an allowable error threshold, establishing the supply voltage at a second voltage level, the second voltage level lower than the first voltage level.

2. The method of claim 1, further comprising:
performing at least a second memory operation on the memory device through use of the supply voltage established at the second voltage;
determining a second error parameter associated with the second memory operation;
determining whether the second error parameter is below a second allowable error threshold;
In response to determining that the second error parameter is below the second allowable error threshold, establishing a first voltage detect threshold for power loss events at the second voltage level.

3. The method of claim 1, wherein performing a first memory operation comprises performing multiple memory operations on the memory device through use of the supply voltage established at the first voltage level.

4. The method of claim 3, wherein determining a first error parameter associated with the first memory operation comprises collecting the first error parameter associated with the performance of the multiple memory operations.

5. The method of claim 1, further comprising:
performing a second memory operation on the memory device through use of the supply voltage established at the second voltage level;
determining a second error parameter associated with the second memory operation;
determining whether the second error parameter is below a second allowable error threshold;
in response to determining that the second error parameter is not below the second allowable error threshold, establishing the supply voltage at a third voltage level, the third voltage level above the second voltage level.

6. The method of claim 5, wherein the third voltage level is above the second voltage level but below the first voltage level.

7. The method of claim 6, wherein at least one of the first and second error parameters comprises a bit error rate.

8. The method of claim 5, further comprising in response to determining that the second error parameter is not below the second allowable error threshold, establishing a voltage drop detection threshold above the third voltage level.

9. A memory system, comprising:
one more memory devices;
a memory controller including processing circuitry, the memory controller configured to perform operations comprising:
establishing a voltage drop detection threshold of a first memory device,
wherein a power loss event is triggered when a supply voltage falls below the voltage drop detection threshold, comprising,
collecting an error parameter associated with performing multiple memory operations on the first memory device, wherein the multiple memory operations are performed while applying a supply voltage at a second supply voltage level of the first memory device which is less than a first supply voltage level established as a first operating voltage for the first memory device;
determining whether the error parameter is below a first allowable error threshold; and
in response to determining that the error parameter is below the first allowable error threshold, establishing the voltage drop detection threshold at a further voltage level less than the first supply voltage level.

10. The system of claim 9, wherein the voltage drop detection threshold is established at the second supply voltage level.

11. The system of claim 9, wherein the voltage drop detection threshold is established at a voltage level between the first supply voltage level and the second supply voltage level, wherein the voltage level is one or two digital-to-analog converter steps lower than the first supply voltage level.

12. The system of claim 9, wherein the operations further comprise establishing an initial voltage drop detection threshold of the first memory device in reference to the first supply voltage level established as the first operating voltage for the first memory device, wherein the initial voltage drop detection threshold is higher than the first operating voltage.

13. The system of claim 9, wherein the control circuitry is further for performing multiple initial memory operations on the first memory device while applying the first operating voltage at the first supply voltage level before the collecting of the error parameter in response to memory operations performed while applying the supply voltage at the second supply voltage level.

14. The system of claim 9, wherein the first memory device comprises a NAND storage device, wherein the error parameter represents data bus errors of the first memory device, and wherein collecting the error parameter comprises assessing a bit-error-rate associated with reading back data from NAND latches of the NAND storage device.

15. The system of claim 9, wherein the operations further comprise:
detecting a power loss event during performance of a memory operation on the first memory device of the one or more memory devices;
after the power loss event, determining a respective error parameter associated with the memory operation affected by the power loss event;
determining whether the respective error parameter is below a second allowable threshold; and performing one of the following operations,
in response to determining that the respective error parameter is below a second allowable error threshold, updating a false positive trigger statistic; and
in response to determining that the respective error parameter exceeds the allowable error threshold, maintaining the established voltage drop detection threshold at the established voltage level.

16. The system of claim 15, wherein the operations further comprise, in response to determining the false positive trigger statistic exceeds a false positive trigger threshold, changing the established voltage drop detection threshold to a second voltage drop detection threshold.

17. The system of claim 9, wherein the operations further comprise:
establishing a second voltage drop detection threshold of a second memory device, wherein a second power loss event is triggered when a supply voltage falls below a second voltage drop detection threshold established for the second memory device, comprising,
collecting a second error parameter associated with performing multiple memory operations on the second memory device, wherein the multiple memory operations are performed while applying a supply voltage at a third supply voltage level of the second memory device;
determining whether the second error parameter is below a second allowable error threshold; and
in response to determining that the second error parameter is below the allowable error threshold, establishing the voltage drop detection threshold at a voltage level less than the third supply voltage level.

18. The system of claim 17, wherein the third supply voltage is equal to the second supply voltage applied to the first memory device.

19. The system of claim 9, wherein the memory device is configured to operate in a multiple of modes, wherein the voltage drop detection threshold is a first voltage drop detection threshold; and
wherein the operations further comprise associating the first voltage drop detection threshold with a first of the multiple modes and establishing a second voltage drop detection threshold for a second of the multiple modes;
in response to the first memory device being operated in a selected mode, establishing one of the first and second voltage drop detection thresholds in accordance with the selected mode.

* * * * *